United States Patent
Oto

(10) Patent No.: US 9,417,503 B2
(45) Date of Patent: Aug. 16, 2016

(54) LIGHT SOURCE DEVICE AND WAVELENGTH CONVERSION METHOD

(75) Inventor: Masanori Oto, Yokohama (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 174 days.

(21) Appl. No.: 14/350,805

(22) PCT Filed: Sep. 3, 2012

(86) PCT No.: PCT/JP2012/005551
§ 371 (c)(1),
(2), (4) Date: Apr. 9, 2014

(87) PCT Pub. No.: WO2013/069179
PCT Pub. Date: May 16, 2013

(65) Prior Publication Data
US 2014/0293403 A1      Oct. 2, 2014

(30) Foreign Application Priority Data
Nov. 10, 2011    (JP) .................. 2011-246396

(51) Int. Cl.
*G02B 6/00* (2006.01)
*G02F 1/35* (2006.01)
(Continued)

(52) U.S. Cl.
CPC .............. *G02F 1/3775* (2013.01); *G02F 1/353* (2013.01); *G02F 1/3551* (2013.01);
(Continued)

(58) Field of Classification Search
CPC ..... G02F 1/3775; G02F 1/353; G02F 1/3551; G02F 1/3558; H01S 3/0675; H01S 3/06783; H01S 3/06791; H01S 3/109; H01S 5/146

USPC .................. 385/140; 359/328, 341.4
See application file for complete search history.

(56) References Cited

U.S. PATENT DOCUMENTS 6,272,165 B1    8/2001   Stepanov et al.
6,760,151 B1 *  7/2004   Vail ................. H01S 3/005
                                                  359/334

(Continued)

FOREIGN PATENT DOCUMENTS

EP      0868766 A1    10/1998
JP      H06-160919 A   6/1994
(Continued)

OTHER PUBLICATIONS

Umeki, T. et al., "Phase Sensitive Degenerate Parametric Amplification Using Highly Efficient PPLN Ridge Waveguides", Optical Fiber Communication Conference and Exposition (OFC/NFOEC) and the National Fiber Optic Engineers Conference, Mar. 2011, pp. 1-3; OThU6.

*Primary Examiner* — Jerry Blevins
(74) *Attorney, Agent, or Firm* — Rabin & Berdo, P.C.

(57) ABSTRACT

A light source emits first incident light to a first polarization-reversed structure. The first polarization-reversed structure then converts the wavelength of the first incident light to emit a higher harmonic wave. A fiber coupler divides the higher harmonic wave output from the first polarization-reversed structure into output light emitted from the light source device and feedback light. The feedback light enters a second polarization-reversed structure. The second polarization-reversed structure then converts the wavelength of the feedback light to emit second incident light. The second incident light has the same wavelength as the first incident light. The second incident light enters a first wavelength converter.

17 Claims, 2 Drawing Sheets

(51) Int. Cl.
- *G02F 2/02* (2006.01)
- *H01S 3/00* (2006.01)
- *G02F 1/377* (2006.01)
- *H01S 3/109* (2006.01)
- *H01S 3/067* (2006.01)
- *H01S 5/14* (2006.01)
- *G02F 1/355* (2006.01)

(52) U.S. Cl.
CPC .......... *G02F 1/3558* (2013.01); *H01S 3/0675* (2013.01); *H01S 3/06783* (2013.01); *H01S 3/06791* (2013.01); *H01S 3/109* (2013.01); *H01S 5/146* (2013.01); *G02F 2001/3507* (2013.01); *G02F 2001/3542* (2013.01); *G02F 2201/02* (2013.01); *G02F 2203/15* (2013.01)

(56) References Cited

U.S. PATENT DOCUMENTS

| | | |
|---|---|---|
| 2005/0163187 A1* | 7/2005 | Spinelli .......... H01S 3/083 372/94 |
| 2010/0061408 A1 | 3/2010 | Nakazawa et al. |

FOREIGN PATENT DOCUMENTS

| | | |
|---|---|---|
| JP | H06-250242 A | 9/1994 |
| JP | 2000-501244 | 2/2000 |
| JP | 2008-089873 A | 4/2008 |
| JP | 2008-511182 A | 4/2008 |
| WO | WO 2006-026540 A2 | 3/2006 |
| WO | WO-2008/029859 A1 | 3/2008 |

\* cited by examiner

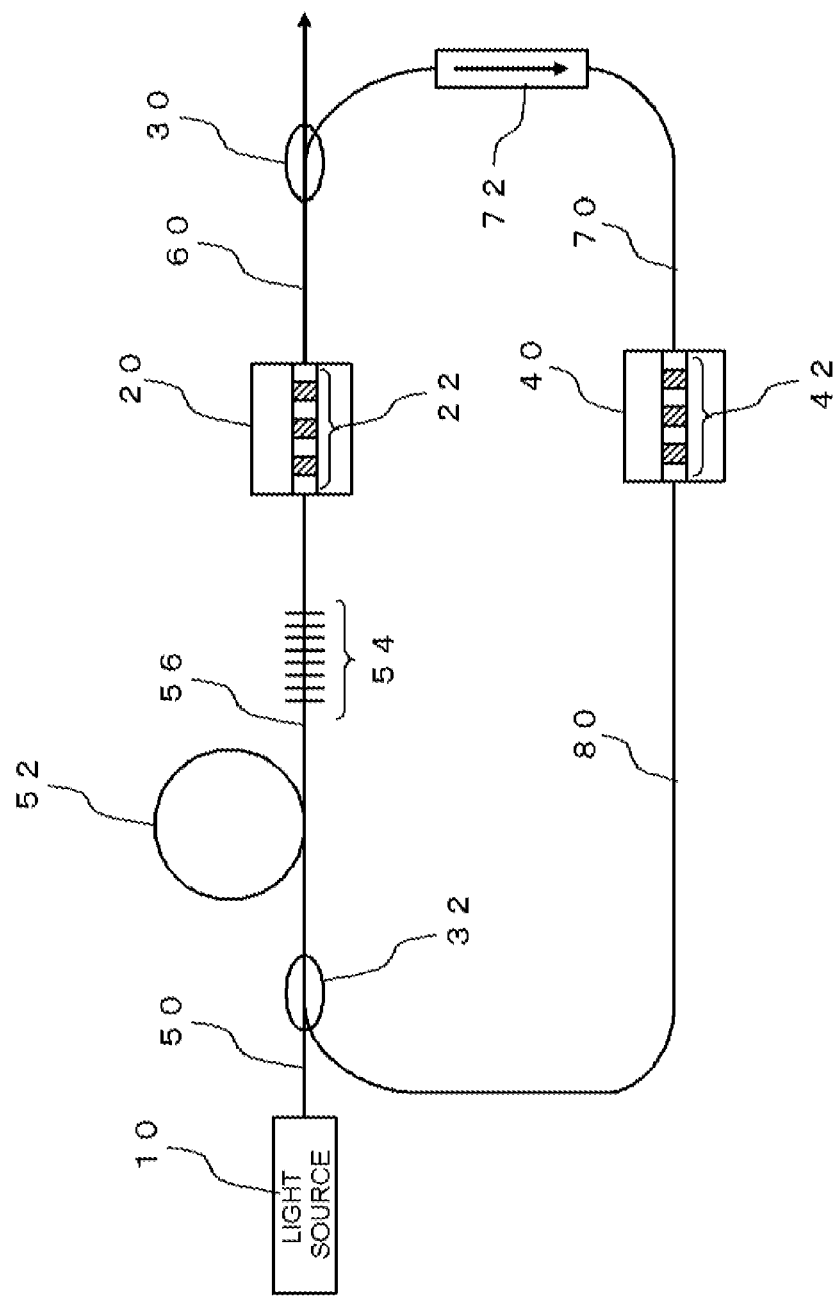

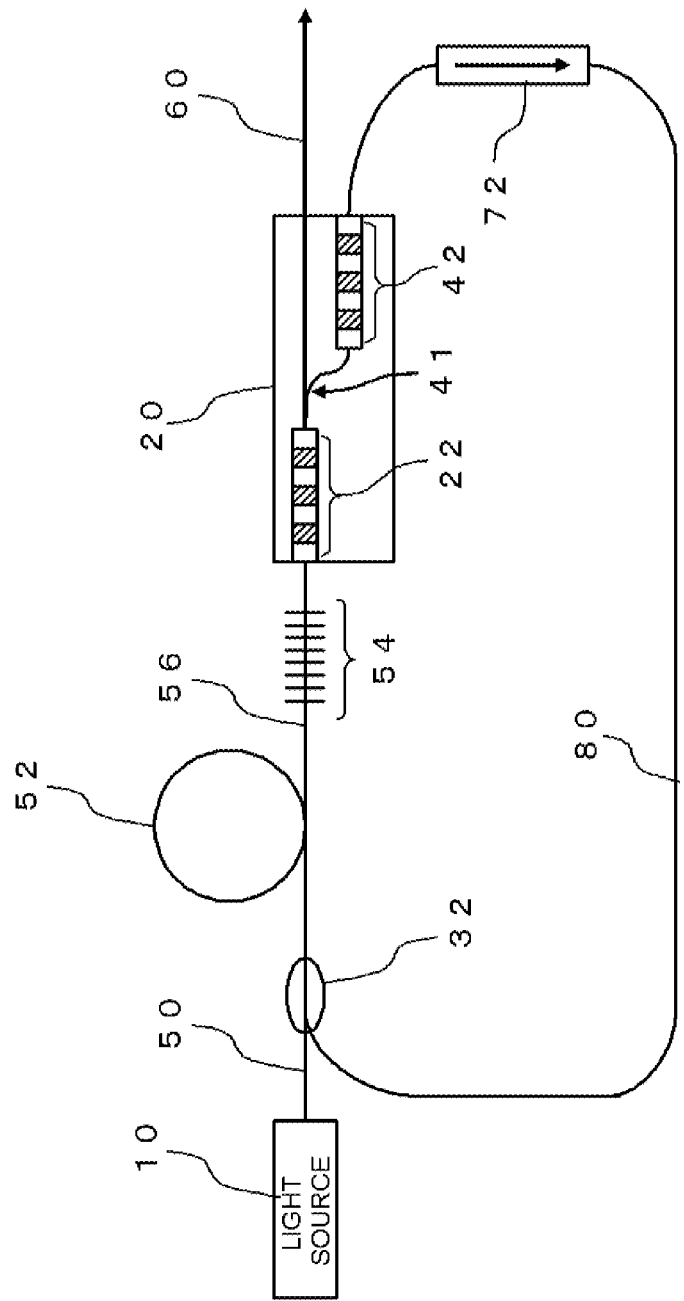

LIGHT SOURCE DEVICE AND WAVELENGTH CONVERSION METHOD

TECHNICAL FIELD

The present invention relates to a light source device and a wavelength conversion method.

BACKGROUND ART

The development of the measuring techniques using laser beams has been promoted recently. Examples of such techniques include a technique for detecting the amount of a specific substance in a test sample by using the absorption intensity of a laser beam (laser spectroscopic measurement), and a technique for using a laser beam to detect minimal variations in a subject to be measured (interferometer). These measuring techniques are desired to have reduced laser emission line widths.

A laser beam is also used as pump light for generating an electromagnetic wave at terahertz frequencies. Such a laser beam, too, is desired to have a reduced emission line width.

Patent Documents 1 and 2 each describe a laser system with a ring resonator in which a rare-earth doped fiber is used as a gain medium. Especially Patent Document 1 describes that the rare-earth doped fiber configuring the ring resonator is provided with a fiber Bragg grating in order to reduce the line width of output light.

Patent Document 1: Japanese Translation of PCT Application No. 2000-501244

Patent Document 2: Japanese Translation of PCT Application No. 2008-511182

A novel method needs to be implemented to reduce the line width of output light at low cost.

SUMMARY

The present invention was contrived in view of the above circumstance, and an object thereof is to provide a light source device and a wavelength conversion method which are capable of reducing the line width of output light by means of a novel method.

A light source device according to the present invention has a light source, a first wavelength converter, a dividing portion, and a second wavelength converter. The light source emits first incident light to the first wavelength converter. The first wavelength converter converts the wavelength of the first incident light to emit a higher harmonic wave. The dividing portion divides the higher harmonic wave output from the first wavelength converter into output light emitted from the light source device and feedback light. The feedback light enters the second wavelength converter. The second wavelength converter converts the wavelength of the feedback light to emit second incident light that has the same wavelength as the first incident light. The second incident light enters the first wavelength converter.

A wavelength conversion method according to the present invention first emits the first incident light to the first wavelength converter, and outputs a higher harmonic wave of the first incident light from the first wavelength converter. This higher harmonic wave is divided into output light and feedback light. Then, the wavelength of the feedback light is converted to generate second incident light that has the same wavelength as the first incident light. The second incident light enters the first wavelength converter along with the first incident light.

According to the present invention, the line width of output light can be reduced by the implementation of a novel method.

BRIEF DESCRIPTION OF THE DRAWINGS

The above and other objects, features and advantages of the present invention will become more apparent from the following description of preferred embodiments and the accompanying drawings provided below.

FIG. 1 is a diagram showing a configuration of a light source device according to a first embodiment; and FIG. 2 is a diagram showing a configuration of a light source device according to a second embodiment.

DETAILED DESCRIPTION

Embodiments of the present invention are now described hereinafter with reference to the drawings. The same reference numerals are used to indicate the same components throughout the drawings, and therefore descriptions thereof are omitted accordingly.

First Embodiment

FIG. 1 is a diagram showing a configuration of a light source device according to a first embodiment. This light source device is used as, for example, a light source for spectroscopic analysis, a light source of an interferometer, or a light source of pump light for generating an electromagnetic wave. This light source device has a light source 10, a first polarization-reversed structure 22 (a first wavelength converter), a fiber coupler 30 (a dividing portion), and a second polarization-reversed structure 42 (a second wavelength converter). The light source 10 emits first incident light to the first polarization-reversed structure 22. The first polarization-reversed structure 22 converts the first incident light to emit a higher harmonic wave. The fiber coupler 30 divides the higher harmonic wave output from the first polarization-reversed structure 22 into output light to be emitted from the light source device and feed back light. The feedback light enters the second polarization-reversed structure 42. The second polarization-reversed structure 42 converts the wavelength of the feedback light to emit second incident light. The second incident light has the same wavelength as the first incident light. The second incident light enters the first wavelength converter. The details of this configuration are described hereinbelow.

The light source 10 is, for example, a laser diode. This laser diode has an oscillation wavelength of, for example, 980 nm, although it is not limited thereto. Light that is output from the light source 10 enters the first polarization-reversed structure 22 through an optical fiber 50, a rare-earth doped fiber 52, and an optical fiber 56. The optical fibers 50, 56 and the rare-earth doped fiber 52 are polarization-maintaining optical fibers. The rare-earth doped fiber 52 is used as a gain medium of a laser beam. The optical fiber 56 has an FBG (fiber Bragg grating) 54. The first incident light emitted from the light source 10 resonates between the light source 10 and the FBG 54 and is emitted as a laser beam to the first polarization-reversed structure 22. In other words, the light source of the light source device has a fiber resonator.

The first polarization-reversed structure 22 is formed in a wavelength conversion element 20. The wavelength conversion element 20 is formed using, for example, ferroelectric crystal. This ferroelectric crystal is, but not limited to, for example, $LiNbO_3$ added with Mg. A waveguide is formed in the ferroelectric crystal. The structure of the waveguide is not limited to a particular structure. For instance, the waveguide may have a ridge structure or an embedding structure. The first polarization-reversed structure 22 is provided in this waveguide. The first polarization-reversed structure 22 is a pseudo phase matching element. The polarization reversal cycle of the first polarization-reversed structure 22 is defined in such a manner as to generate a higher harmonic wave of first input light that enters the wavelength conversion element 20. For example, the first polarization-reversed structure 22 is defined in such a manner as to generate a second higher harmonic wave of the first incident light.

Output light from the wavelength conversion element 20 is emitted through an optical fiber 60 in the form of the output light emitted from the light source device. The optical fiber 60 is a polarization-maintaining optical fiber. The optical fiber 60 is provided with the fiber coupler 30. The fiber coupler 30 divides the output light into the output light emitted from the light source device and feedback light.

The feedback light obtained at the fiber coupler 30 enters the second polarization-reversed structure 42 via an optical fiber 70. The optical fiber 70 is a polarization-maintaining optical fiber. It should be noted that the optical fiber 70 is provided with an isolator 72. Light coming from the wavelength conversion element 20 toward the second polarization-reversed structure 42 passes through the isolator 72.

The second polarization-reversed structure 42 is formed in a wavelength conversion element 40. The wavelength conversion element 40 is formed using, for example, ferroelectric crystal. This ferroelectric crystal is, but not limited to, for example, LiNbO$_3$ added with Mg. A waveguide is formed in the ferroelectric crystal. The structure of the waveguide is not limited to a particular structure. For instance, the waveguide may have a ridge structure or an embedding structure. The second polarization-reversed structure 42 is provided in this waveguide. The second polarization-reversed structure 42 is a pseudo phase matching element. The polarization reversal cycle of the second polarization-reversed structure 42 is defined in such a manner as to convert the feedback light (i.e., the higher harmonic wave of the first input light) into light having the same wavelength as the first input light (second incident light). For example, when the feedback light is a second higher harmonic wave of the first incident light, the second polarization-reversed structure 42 is defined in such a manner as to convert a degeneracy parameter of the second higher harmonic wave (Optical Parametric Oscillate: OPO).

The second incident light that is output from the wavelength conversion element 40 enters the rare-earth doped fiber 52 via an optical fiber 80 and a fiber coupler 32. The optical fiber 80 is a pseudo phase matching element. The fiber coupler 32 has two incidence portions. One of the incidence portions of the fiber coupler 32 is connected to the optical fiber 50, and the other incidence portion to the optical fiber 80. An output portion of the fiber coupler 32 is connected to the rare-earth doped fiber 52. In other words, the second incident light enters the rare-earth doped fiber 52 along with the first incident light.

Here, suppose that the length of an optical path extending from the second polarization-reversed structure 42 to the first polarization-reversed structure 22 through the optical fiber 80, the fiber coupler 32, and the rare-earth doped fiber 52 (described as "first optical path," hereinafter) is $l_1$. Also, suppose that the length of an optical path extending from the first polarization-reversed structure 22 to the second polarization-reversed structure 42 through the optical fiber 60, the fiber coupler 30, and the optical fiber 70 (described as "second optical path," hereinafter) is $l_2$. The lengths $l_1$ and $l_2$ satisfy the relationship expressed in the following formula (1).

$$\frac{n_\omega l_1}{\lambda_\omega} = m \frac{n_{2\omega} l_2}{\lambda_{2\omega}} \tag{1}$$

where $n_\omega$ represents a refractive index of the first optical path obtained at the wavelength of the first incident light, $n_{2\omega}$ a refractive index of the second optical path obtained at the wavelength of the higher harmonic wave generated by the first polarization-reversed structure 22, $\lambda_\omega$ the wavelength of the first incident light, $\lambda_{2\omega}$ the wavelength of the higher harmonic wave, and m an integer.

As a result of satisfying the formula (1) shown above, the phase of the first incident light and the phase of the second incident light synchronize with each other at the time when the first incident light and the second incident light enter the first polarization-reversed structure 22. It should be noted in the example shown in FIG. 1 that the phase of the first incident light and the phase of the second incident light are synchronized with each other as well at the time when the first incident light and the second incident light are multiplexed by the fiber coupler 32.

Note that each optical fiber and the wavelength conversion element 20 may be joined physically or combined optically by means of a lens.

The operations and effects of the present embodiment are described next. The higher harmonic wave that is output from the first polarization-reversed structure 22 has a narrow line width because ASE (Amplified Spontaneous Emission) light associated with the first incident light is removed therefrom. For this reason, the second incident light generated from this higher harmonic wave has a narrower line width than the first incident light. Hence, the incident light that enters the first polarization-reversed structure 22 has a narrow half bandwidth. Therefore, the output light from the light source device also has a narrow half bandwidth (line width).

The second incident light enters the rare-earth doped fiber 52 along with the first incident light. Therefore, the half bandwidth of a laser beam itself that enters the wavelength conversion element 20 becomes narrow, making the effects described above more remarkable.

When the phases of the first incident light and the second incident light are not synchronized, the line width of the output light from the light source device becomes wide. In the present embodiment, however, the phase of the first incident light and the phase of the second incident light are synchronized with each other at the time when the first incident light and the second incident light are multiplexed by the fiber coupler 32. This makes the line width of the output light from the light source devices even narrower.

The simple configuration of the light source device leads to low cost of production of the light source device. For example, the light source device shown in FIG. 1 does not require any complicated control systems. Furthermore, the FBG 54 is provided in the optical fiber 56. The expensive rare-earth doped fiber 52 does not have to be provided with an FBG. Therefore, unlike a configuration in which an FBG is provided in the rare-earth doped fiber 52, even if errors occur in the production of the FBG 54, an increase in the production cost of the light source device can be suppressed.

Second Embodiment

FIG. 2 is a diagram showing a configuration of a light source device according to a second embodiment. The light source device according to this embodiment has the same configuration as the light source device according to the first embodiment except for the following features.

First, the ferroelectric crystal of the wavelength conversion element 20 has the second polarization-reversed structure 42 in addition to the first polarization-reversed structure 22. This ferroelectric crystal also has a dividing waveguide 41 (a dividing portion). The dividing waveguide 41 has the incidence side thereof connected to the first polarization-reversed structure 22 and the output side to the optical fiber 60 and the second polarization-reversed structure 42. The dividing waveguide 41 divides a higher harmonic wave emitted from the first polarization-reversed structure 22 into output light emitted from the light source device and feedback light. This feedback light is converted into second incident light by the second polarization-reversed structure 42.

The second incident light that is emitted from the second polarization-reversed structure 42 enters the fiber coupler 32 via the isolator 72 and the optical fiber 80.

The present embodiment, too, can provide the same effects as the first embodiment. Moreover, because the first polarization-reversed structure 22, the second polarization-reversed structure 42, and the dividing portion are provided in a single ferroelectric crystal, the size of the light source device according to the present embodiment can be made small.

The embodiments of the present invention are described above with reference to the drawings; however, these embodiments are merely illustrative of the present invention, and therefore various other configurations can be adopted. For instance, in the first and second embodiments, a wavelength conversion element based on other principles may be used in place of the first polarization-reversed structure 22 and the second polarization-reversed structure 42.

This application claims priority from Japanese Patent Application No. 2011-246396 filed on Nov. 10, 2011, the entire content of which is incorporated herein by reference.

The invention claimed is:

1. A light source device, comprising:
a light source that emits first incident light;
a first wavelength converter that receives the first incident light and converts a wavelength of the first incident light to emit a higher harmonic wave;
a dividing portion that divides the higher harmonic wave output from the first wavelength converter into output light emitted from the light source device and feedback light; and
a second wavelength converter that receives the feedback light and converts a wavelength of the feedback light to emit second incident light that has a same wavelength as the first incident light,
wherein
the second incident light enters the first wavelength converter without depending on the light source,
the first wavelength converter, the dividing portion, and the second wavelength converter are formed in a single ferroelectric crystal,
the first wavelength converter and the second wavelength converter each have a polarization-reversed structure, and
the dividing portion is a dividing waveguide formed in the ferroelectric crystal.

2. The light source device according to claim 1, wherein when a length of a first optical path through which the second incident light from the second wavelength converter passes to enter the first wavelength converter is $l_1$, and a length of a second optical path through which the higher harmonic wave from the first wavelength converter passes to enter the second wavelength converter is $l_2$, the following formula (1) is satisfied:

$$\frac{n_\omega l_1}{\lambda_\omega} = m \frac{n_{2\omega} l_2}{\lambda_{2\omega}} \quad (1)$$

where $n_\omega$ represents a refractive index of the first optical path obtained at a wavelength of the first incident light, $n_{2\omega}$ represents a refractive index of the second optical path obtained at a wavelength of the higher harmonic wave, $\lambda_\omega$ represents the wavelength of the first incident light, $\lambda_{2\omega}$ represents the wavelength of the higher harmonic wave, and m represents an integer.

3. The light source device according to claim 2, further comprising:
a gain medium that is provided between the light source and the first wavelength converter and used for laser oscillation,
wherein the second incident light enters the gain medium along with the first incident light.

4. The light source device according to claim 2, wherein the dividing portion is a fiber coupler.

5. The light source device according to claim 1, further comprising:
a gain medium that is provided between the light source and the first wavelength converter and used for laser oscillation,
wherein the second incident light enters the gain medium along with the first incident light.

6. The light source device according to claim 5, wherein the gain medium is a polarization-maintaining optical fiber, and
the polarization-maintaining optical fiber has a fiber Bragg grating.

7. The light source device according to claim 6, wherein the dividing portion is a fiber coupler.

8. The light source device according to claim 6, wherein the higher harmonic wave is a second higher harmonic wave.

9. The light source device according to claim 5, wherein the dividing portion is a fiber coupler.

10. The light source device according to claim 5, wherein the higher harmonic wave is a second higher harmonic wave.

11. The light source device according to claim 1, wherein the dividing portion is a fiber coupler.

12. The light source device according to claim 11, wherein the higher harmonic wave is a second higher harmonic wave.

13. The light source device according to claim 1, wherein the higher harmonic wave is a second higher harmonic wave.

14. A wavelength conversion method, comprising:
emitting first incident light to a first wavelength converter and outputting a higher harmonic wave of the first incident light from the first wavelength converter;
using a dividing portion to divide the higher harmonic wave into output light emitted from a light source and feedback light; and
using a second wavelength converter to convert a wavelength of the feedback light to generate second incident light having a same wavelength as the first incident light, and emitting the second incident light to the first wavelength converter independently of the light source along with the first incident light;
wherein the first wavelength converter, the dividing portion, and the second wavelength converter are formed in a single ferroelectric crystal, the first wavelength converter and the second wavelength converter each have a polarization-reversed structure, and the dividing portion is a dividing waveguide formed in the ferroelectric crystal.

15. An apparatus, comprising:

a light source;

a first wavelength conversion element to convert a first incident light from the light source into a higher harmonic wave output;

a divider to divide the higher harmonic wave output into output light and feedback light; and a second wavelength conversion element coupled to the divider, the second wavelength conversion element to convert the feedback light into second incident light having a same wavelength as the first incident light;

wherein the second incident light enters the first wavelength conversion element without depending on the light source, the first wavelength conversion element, the divider, and the second wavelength conversion element are formed in a single ferroelectric crystal, the first wavelength conversion element and the second wavelength conversion element each have a polarization-reversed structure, and the divider is a dividing waveguide formed in the ferroelectric crystal.

16. The apparatus of claim 15, further comprising a first optical fiber, a coupler that couples the first optical fiber to the light source, and a gain medium coupled to the coupler.

17. The apparatus of claim 16, further comprising a second optical fiber coupled to the divider, and a third optical fiber to carry the feedback light.

* * * * *